United States Patent [19]

Newton et al.

[11] 4,348,646

[45] Sep. 7, 1982

[54] TIME-DELAY-TRIGGERED TRAPATT OSCILLATOR WITH DIRECTIONAL FILTER

[75] Inventors: Barrie H. Newton, Copthorne; Peter L. Booth, Reigate; Robert Davies, Copthorne, all of England

[73] Assignee: U.S. Philips Corporation, New York, N.Y.

[21] Appl. No.: 151,218

[22] Filed: May 19, 1980

[30] Foreign Application Priority Data

May 23, 1979 [GB] United Kingdom ............... 7917969

[51] Int. Cl.³ ............................................. H03B 9/14
[52] U.S. Cl. ...................................... 331/77; 331/96; 331/107 SL
[58] Field of Search ............... 331/77, 96, 99, 107 SL, 331/107 DP, 107 C

[56] References Cited

U.S. PATENT DOCUMENTS 3,628,185  12/1971  Evans et al. ................ 331/107 DP
3,665,339   5/1972  Liu ............................... 331/107 SL
3,858,123  12/1974  Ohta et al. ................... 331/107 DP

OTHER PUBLICATIONS

Furukawa, "TRAPATT Oscillators with High Frequency Stability and High Power", Electronics And Communications in Japan, vol. 57B, No. 9, 1974, pp. 96-104.

Newton, "M.I.C. TRAPATT Oscillator for Efficient S-Band Operation", Electronics Letters, vol. 11, 10 Jul. 1975, pp. 299-300.

Risko et al., "I Band (8-10 GHz) TRAPATT-Diode Sources", Electronics Letters, vol. 19, 29 Nov. 1973, pp. 572-573.

*Primary Examiner*—Siegfried H. Grimm
*Attorney, Agent, or Firm*—Robert J. Kraus

[57] ABSTRACT

A time-delay-triggered TRAPATT oscillator comprising a length of delay line with a TRAPATT diode at one end and a matching filter at the other end, and a constant resistance directional filter at the output end of the matching filter.

2 Claims, 1 Drawing Figure

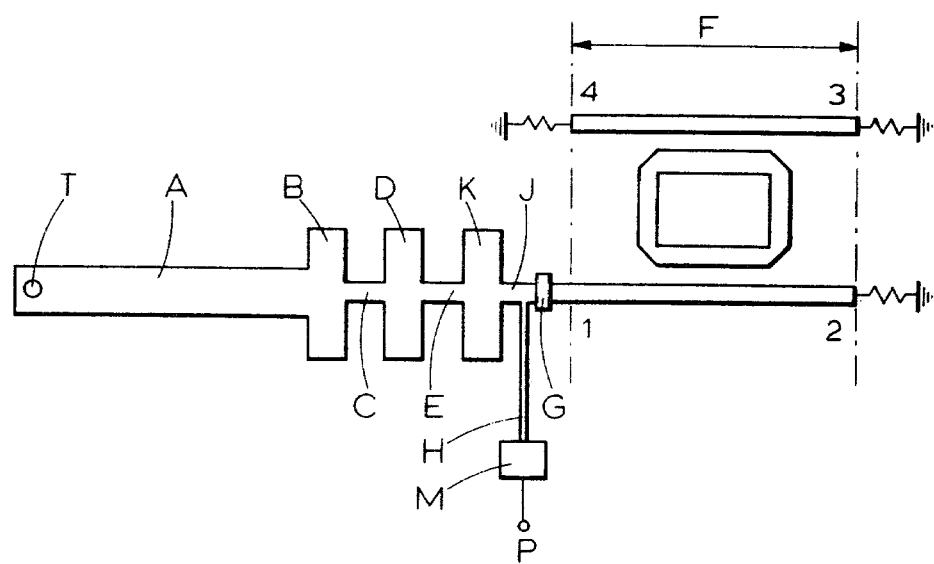

TIME-DELAY-TRIGGERED TRAPATT OSCILLATOR WITH DIRECTIONAL FILTER

BACKGROUND OF THE INVENTION

This invention relates to a time-delay-triggered TRAPATT oscillator circuit comprising a TRAPATT diode, a length of delay line connected in series with the diode and a matching filter in the form of a chain of sections of transmission line of successively different impedances connected to the end of the delay line remote from the diode. Such a circuit is described by W. J. Evans in "Circuits for high-efficiency avalanche-diode oscillators", I.E.E.E. Trans. MTT-17, 1060, (1969). However, it has been reported (J. E. Carroll, "The use of pseudo-transients in the solution of the Evans TRAPATT circuit", Proceedings of the 8th International MOGA Conference, Amsterdam, 1970; J. E. Carroll and R. H. Crede, "A computer simulation of TRAPATT circuits", Int. J. Electron. 32, 273 (1972)) that successful operation of this circuit depends markedly on a number of parameters, and the complexity of the circuit (which comprises series tuners in the form of transmission lines of fairly critical lengths and impedances) is a considerable hindrance to the design and construction of simple TRAPATT oscillator modules. In particular, since the Evans circuit relies for its operation upon repeated triggering of the diode by pulses reflected from the junction of the delay line and the filter, then reflections from within the filter itself or from circuit elements beyond the filter can cause unwanted, spurious triggering. As can be appreciated from FIG. 6 of the Evans paper, such reflections from within the filter can be caused by large impedance mismatches between the successive portions of the filter which, in the arrangement described with reference to FIGS. 4 to 6 of the Evans paper, is in the form of a co-axial line with tuning sleeves.

It has been observed in practice that if the matching filter is terminated in a component, such as a further filter or circulator, which on a time-domain reflectometer has a response similar to that of the matching filter, then coherence of the TRAPATT oscillation can be greatly reduced. It is thought that this degraded performance is due to spurious trigger voltages caused by reflections from the terminating component.

SUMMARY OF THE INVENTION

The Applicants have now found that the introduction of a directional filter between the matching filter and the terminating component restores the coherence of oscillation.

Accordingly therefore a TRAPATT oscillator circuit of the kind referred to above is characterized by a directional filter connected to the end of the matching filter remote from the delay line and means for deriving from the directional filter energy at the desired frequency.

As described by S. B. Cohn and F. S. Coale, in "Directional Channel-Separation Filters" Proceedings of the I.R.E. August 1956, pages 1018 to 1024, a directional filter is a constant-resistance-type network when it is properly terminated. Thus the problems associated with other devices having impedances which are very frequency-sensitive do not arise.

Suitably, the directional filter is a standing-wave loop filter and may be of the general configuration shown at (a) or (b) of FIG. 3 of the Cohn and Coale paper.

BRIEF DESCRIPTION OF THE DRAWING

The invention will now be described by way of example with reference to the single FIGURE, which illustrates a microstrip embodiment of the oscillator.

DESCRIPTION OF THE PREFERRED EMBODIMENT

The FIGURE illustrates an embodiment comprising an oscillator section and matching filter constructed in microstrip on an alumina substrate followed by a travelling-wave single-loop directional filter which in this particular case is 1.5 mm poly guide stripline. The ground planes of the microstrip and stripline are not shown.

The embodiment was designed for operation at 2.5 GHz. At the left of the FIGURE is a TRAPATT diode T which is connected between the ground plane and one end of a delay line A. The delay line has a characteristic impedance of 30 ohms.

The effective length of the delay line, between the diode T and element B of the matching filter, is 18 mm. Elements B, D and K of the matching filter are each 2.6 mm long in the direction of propagation and elements C and E are 2.4 mm long. Elements B, D and K are identical and are proportioned to have impedances of 10.5 ohms while the elements C and E have impedances of 48 ohms. From the element K extends a line J of 50 ohms impedance which leads into an arm 1 of a travelling-wave single-loop directional filter F constructed in stripline. The other three arms 2, 3 and 4 are terminated in their matching impedances, in this case 50 ohms.

The particular arrangement described presents an impedance to the TRAPATT diode, at 2.5 GHz of about 10 ohms and at harmonics thereof presents impedance which approach a short circuit, when the right hand end of element K is terminated in a 50 ohm resistive load.

The arrangements for applying bias to the diode T were of well-known form and comprised a capacitor chip G in the microstrip line J and a high impedance line H which led through the usual bias filter M to a connecting point P for the bias supply.

Because the loop of the directional filter is one wavelength long at the fundamental frequency of 2.5 GHz, energy at that frequency, or at harmonics thereof, entering arm 1 can be extracted from arms 2 and 4. Energy the fundamental and odd harmonics can be extracted at arm 4 and energy at the even harmonics can be extracted at arm 2. Because the matching filter performs very effectively when followed by the constant-resistance directional filter, the output at arm 4 of energy at frequencies other than 2.5 GHz is negligibly small.

It will of course be understood that the invention is not confined to the use of a travelling-wave-loop filter as described, but that other forms of constant-resistance travelling-wave filter may be used as desired.

We claim:

1. A time-delay-triggered TRAPATT oscillator circuit for operating at a predetermined frequency, comprising:
   a delay line;
   a TRAPATT diode connected to one end of the delay line;

a matching filter having one end connected to the delay line at a predetermined distance from the diode, said filter comprising successive sections of transmission line of different impedances;

a directional filter connected to an end of the matching filter remote from the delay line; and means for extracting energy from the directional filter at the predetermined frequency.

2. An oscillator circuit as in claim 1 wherein said directional filter is a travelling-wave loop filter.

* * * * *